(12) United States Patent
Ishikawa et al.

(10) Patent No.: US 8,269,460 B2
(45) Date of Patent: Sep. 18, 2012

(54) DISCONNECTION DETECTING DEVICE

(75) Inventors: Satoshi Ishikawa, Makinohara (JP); Kimihiro Matsuura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 290 days.

(21) Appl. No.: 12/801,418

(22) Filed: Jun. 8, 2010

(65) Prior Publication Data
US 2010/0327878 A1    Dec. 30, 2010

(30) Foreign Application Priority Data

Jun. 25, 2009   (JP) .................................. 2009-151064

(51) Int. Cl.
*H01M 10/46* (2006.01)

(52) U.S. Cl. ....................................................... 320/122

(58) Field of Classification Search .................. 320/116, 320/117, 120, 122, 134, 136
See application file for complete search history.

(56) References Cited

U.S. PATENT DOCUMENTS

| | | | | |
|---|---|---|---|---|
| 4,383,211 A | * | 5/1983 | Staler | 320/102 |
| 5,430,364 A | * | 7/1995 | Gibson | 323/207 |
| 5,578,927 A | * | 11/1996 | Perelle | 324/434 |
| 6,255,826 B1 | | 7/2001 | Ohsawa et al. | |
| 7,417,405 B2 | * | 8/2008 | Carrier et al. | 320/116 |
| 2006/0087286 A1 | * | 4/2006 | Phillips et al. | 320/114 |

FOREIGN PATENT DOCUMENTS

JP    3300309 A    4/2001

* cited by examiner

*Primary Examiner* — Edward Tso
(74) *Attorney, Agent, or Firm* — Edwards Wildman Palmer LLP

(57) ABSTRACT

A switch element is configured to decrease an impedance of a voltage-detection integrated circuit that detect voltage between both ends of unit cells of a higher-ordered battery block, for adjacently-connected pair of the higher-ordered battery block and a lower-ordered battery block. The voltage-detection integrated circuit is configured to detect disconnection of an electrical wire when voltage between both ends of a lowest-ordered unit cell that is detected with the switch element turned on is equal to or lower than a threshold.

4 Claims, 7 Drawing Sheets

$$V_{L1} = \frac{(V_{B1} + V_{B2}) \times Ri1}{(Ri1 + Ri2)} \quad \cdots (1)$$

DISCONNECTION DETECTING DEVICE

CROSS REFERENCE TO RELATED APPLICATION

The priority application Japan Patent Application No. 2009-151064 upon which this patent application is based is hereby incorporated by reference.

BACKGROUND OF THE INVENTION

1. Field of the Invention

The present invention generally relates to a disconnection detecting device, and in particular to a disconnection detecting device for a battery including battery blocks each constituted by mutually-series-connected unit cells, the device being configured to detect a disconnection of an electrical wire connecting a connection point connecting, the device configured to detect disconnection of an electrical wire connected between adjacently-connected pair of higher-ordered battery block and lower-ordered battery block to a ground terminal of a voltage detection unit configured to detect a voltage between both ends of a unit cell belonging to the higher-ordered battery block and a power supply terminal of a voltage detection unit configured to detect a voltage between both ends of a unit cell belonging to a lower-ordered battery block.

2. Description of the Related Art

A hybrid electric vehicle (HEV), which is powered by a conventional internal combustion engine propulsion system and an electric propulsion system, has two batteries, i.e., a low-voltage battery in order of 12 volts for starting the conventional engine and a high-voltage battery for driving an electric motor. In order to obtain a high voltage, the high-voltage battery includes a plurality of unit cells series-connected with each other, the unit cell being a secondary cell such as a nickel-metal-hydride cell and a lithium cell.

The above-described high-voltage battery experiences variation in a voltage between both ends, i.e., a state of charge (SOC), of each unit cell when charging and discharging is repeated. In charging and discharging of a battery, in terms of durability and safety of the unit cells, it is necessary that the charging be stopped when the unit cell having the highest SOC (or voltage between both ends) reaches an upper-limit SOC (or an upper-limit voltage between both ends), and discharging be stopped when the unit cell having the lowest SOC (or voltage between both ends) reaches a lower-limit SOC (or a lower-limit voltage between both ends).

Accordingly, existence of variation in the SOCs depending on the unit cells practically results in decrease in available battery capacity. In a case of the HEV, this further causes insufficient assist/regeneration functionality for supplying complementary battery energy to the engine when the automobile climbs a slope or regenerating energy for the battery when the automobile goes downhill, which may result in decrease in practical vehicle's engine power and fuel consumption.

In this respect, in order to equalize the SOCs of the unit cells, it is necessary to detect a voltage between both ends of each of the unit cells.

In a conventional approach, the unit cells are grouped into the plurality of battery blocks and a voltage-detection integrated circuit IC (voltage detection unit) is provided on a per-block basis, and the voltage between both ends of the each of the unit cells constituting the battery block is detected by means of the dedicated voltage-detection integrated circuits. Also, in order to lower a breakdown voltage of devices constituting the voltage-detection integrated circuit IC, the voltage-detection integrated circuits IC are individually powered by their corresponding battery blocks.

Specifically, the voltage-detection integrated circuit IC employs a positive electric potential of a highest-ordered unit cell of its corresponding battery block as its source electric potential, and a negative electric potential of a lowest-ordered unit cell of the corresponding battery block as a ground electric potential.

According to the above-described configuration, a connection point of mutually-adjacent higher-ordered battery block and lower-ordered battery block is connected via an electrical wire to two terminals, i.e., to a ground terminal of the voltage-detection integrated circuit IC corresponding to a higher-ordered battery block and to a power supply terminal of the voltage-detection integrated circuit IC corresponding to a lower-ordered battery block.

When a disconnection occurs in the electrical wire, a voltage between both ends of the lowest-ordered unit cell of the higher-ordered battery block and the highest-ordered unit cell of the lower-ordered battery block cannot be detected. Also, even when the electrical wire is disconnected, an electric potential occurs between the ground terminal of the voltage-detection integrated circuit IC corresponding to a higher-ordered battery block and the power supply terminal of the voltage-detection integrated circuit IC corresponding to a lower-ordered battery block. The electric potential will be determined in dependence on balance between an impedance of the voltage-detection integrated circuit IC corresponding to a higher-ordered battery block and an impedance of the voltage-detection integrated circuit IC corresponding to a lower-ordered battery block. For example, if these two impedances are one and the same, then the electric potential will be intermediate between a positive electric potential of the highest-ordered unit cell of the higher-ordered battery block and a negative electric potential of the lowest-ordered unit cell of the lower-ordered battery block.

When this intermediate electric potential is resulted, it is not possible to successfully detect occurrence of the disconnection, for the voltages between both ends, detected by the voltage-detection integrated circuit IC, of the lowest-ordered unit cell of the higher-ordered battery block and the highest-ordered unit cell of the lower-ordered battery block are substantially the same as in a normal state. On the other hand, if an impedance of the voltage-detection integrated circuit IC corresponding to the higher-ordered battery block is small, then the potential shifts to the positive electric potential of the highest-ordered unit cell of the higher-ordered battery block, and if an impedance of the voltage-detection integrated circuit IC corresponding to the lower-ordered battery block is small, then the potential shifts to the negative electric potential of the lowest-ordered unit cell of the lower-ordered battery block. It is not possible to discern whether occurrence of such shifting has been caused by an abnormal state of the unit cell or by a disconnection.

In view of this, a cell voltage measuring device disclosed for example in the patent literature 1 is advocated as the above-described apparatus for disconnection detection (for example, see Japanese Patent No. 3300309). The known cell voltage measuring device has resistors each connected between the both ends of each battery block ends so that resistance values of the resistor connected between the both ends of an adjacent higher-ordered battery block and a lower-ordered battery block are different from each other.

Thus, when the voltage between both ends of the battery block is measured in a case of the disconnection, a voltage is measured which is obtained by dividing the voltage between the positive electric potential of the higher-ordered battery block and the negative electric potential of the lower-ordered battery block by the resistor connected to the higher-ordered battery block and the resistor connected to the lower-ordered battery block.

Due to this, when the voltage between both ends of the battery block is detected in the case of the disconnection, a battery block voltage is detected that is not detected in a normal state, and this detected battery block voltage is used to detect the occurrence of the disconnection.

The above-described cell voltage measuring device, for example in a flying capacitor technique, has a large resistance and the disconnection can be successfully detected if charging time is sufficiently large. However, when the charging time is short, the voltage cannot be correctly measured. As has been discussed in the foregoing, when the cell voltage measuring device has the voltage-detection integrated circuit IC powered by the unit cell, the connected resistance is so large that it is difficult to supply power when a disconnection occurs. Also, cost increases when the power is supplied from the low-voltage battery using the DC/DC converter. Further, such conventional device are effective in a case where variation in voltage among the battery blocks is small (with 10 percent maximum specified), but it will erroneously detect occurrence of disconnection due to the large variation in voltage among the battery blocks (for example, see Japanese Patent No. 3300309).

SUMMARY OF THE INVENTION

Accordingly, an object of the present invention is to provide a disconnection detecting device that is capable of effectively detecting a disconnection with inexpensive circuit configuration, in which a source voltage supplied to the voltage detection unit does not vary to a large extent in a disconnection or in a normal state.

In order to attain the above-identified object, provided is a disconnection detecting device for a battery including battery blocks each constituted by unit cells connected in series with each other.

The disconnection detecting device is configured to detect a disconnection of an electrical wire that connects a connection point to two terminals, the connection point being a connection point of a higher-ordered one and a lower-ordered one of the above battery blocks, and the two terminals being (i) a ground terminal of a voltage detection unit configured to detect a voltage between both ends of a unit cell belonging to the higher-ordered battery block and (ii) a power supply terminal of a voltage detection unit configured to detect a voltage between both ends of a unit cell belonging to the lower-ordered battery block.

The disconnection detecting device includes a switch element and a disconnection detecting unit.

The switch element is configured to decrease an impedance of the voltage detection unit that detects the voltages between both ends of the unit cells belonging to the higher-ordered battery block.

The disconnection detecting unit is configured to detect the disconnection of the electrical wire based on a voltage between both ends of a lowest-ordered unit cell of the higher-ordered battery block, the voltage between both ends being detected by the voltage detection unit with the switch element turned on.

As long as the electrical wire is in a normal state, the electric potential of the ground terminal of the voltage detecting unit dedicated to the higher-ordered battery block is equal to a negative electric potential of the lowest-ordered unit cell of the higher-ordered battery block even when the switch element is turned on. Thus, the voltage between both ends of the lowest-ordered unit cell of the higher-ordered battery block will be detected as a positive voltage.

Meanwhile, when the switch element is turned on while the electrical wire is disconnected, the electric potential of the ground terminal of the voltage detection unit dedicated to the higher-ordered battery block becomes larger than the positive electric potential of the lowest-ordered unit cell of the higher-ordered battery block as the impedance of the higher-ordered battery block becomes smaller. Thus, the voltage between both ends of the lowest-ordered unit cell of the higher-ordered battery block is detected, the detected voltage will be small. Accordingly, it is possible to detect disconnection of the electrical wire by detecting the voltage between both ends of the lowest-ordered unit cell of the higher-ordered battery block while the switch element is turned on.

Preferably, the disconnection detection unit is configured to detect the disconnection of the electrical wire based on comparison of the voltage between both ends of the lowest-ordered unit cell of the higher-ordered battery block with a threshold, the voltage between both ends being detected by the voltage detection unit with the switch element turned on.

The disconnection detection unit with the above preferable configuration is capable of accurately detecting the disconnection.

Preferably, the disconnection detecting device of the present invention further includes (c) a first diode connected between both ends of the lowest-ordered unit cell of the higher-ordered battery block in a forward direction from a negative terminal of the lowest-ordered unit cell of the higher-ordered battery block to a positive terminal thereof, and (d) a second diode connected between both ends of the highest-ordered unit cell of the lower-ordered battery block in a forward direction from a negative terminal of the highest-ordered unit cell of the lower-ordered battery block to a positive terminal thereof.

By virtue of voltage clamping by the first diode and the second diode, the disconnection detecting device with the above preferable configuration is capable of preventing an abnormal state from occurring in the voltage detection unit even when the switch element is turned on, for voltage clamping of the first and second diodes prevents the electric potential of the ground terminal of the voltage detection unit dedicated to the higher-ordered battery block and the electric potential of the power supply terminal of the voltage detection unit dedicated to the lower-ordered battery block from becoming unbecomingly large.

BRIEF DESCRIPTION OF THE DRAWINGS

The above and other objects and advantages of the present invention will be apparent upon reading of the following detailed description, taken in conjunction with the following accompanying drawings, in which like reference numerals represent corresponding parts throughout.

DETAILED DESCRIPTION OF THE INVENTION

The following describes a voltage detecting device according to an embodiment of the present invention with reference to the attached drawings. The voltage detecting device of this embodiment is intended for but not limited to in-vehicle installation and application.

Figure 1:
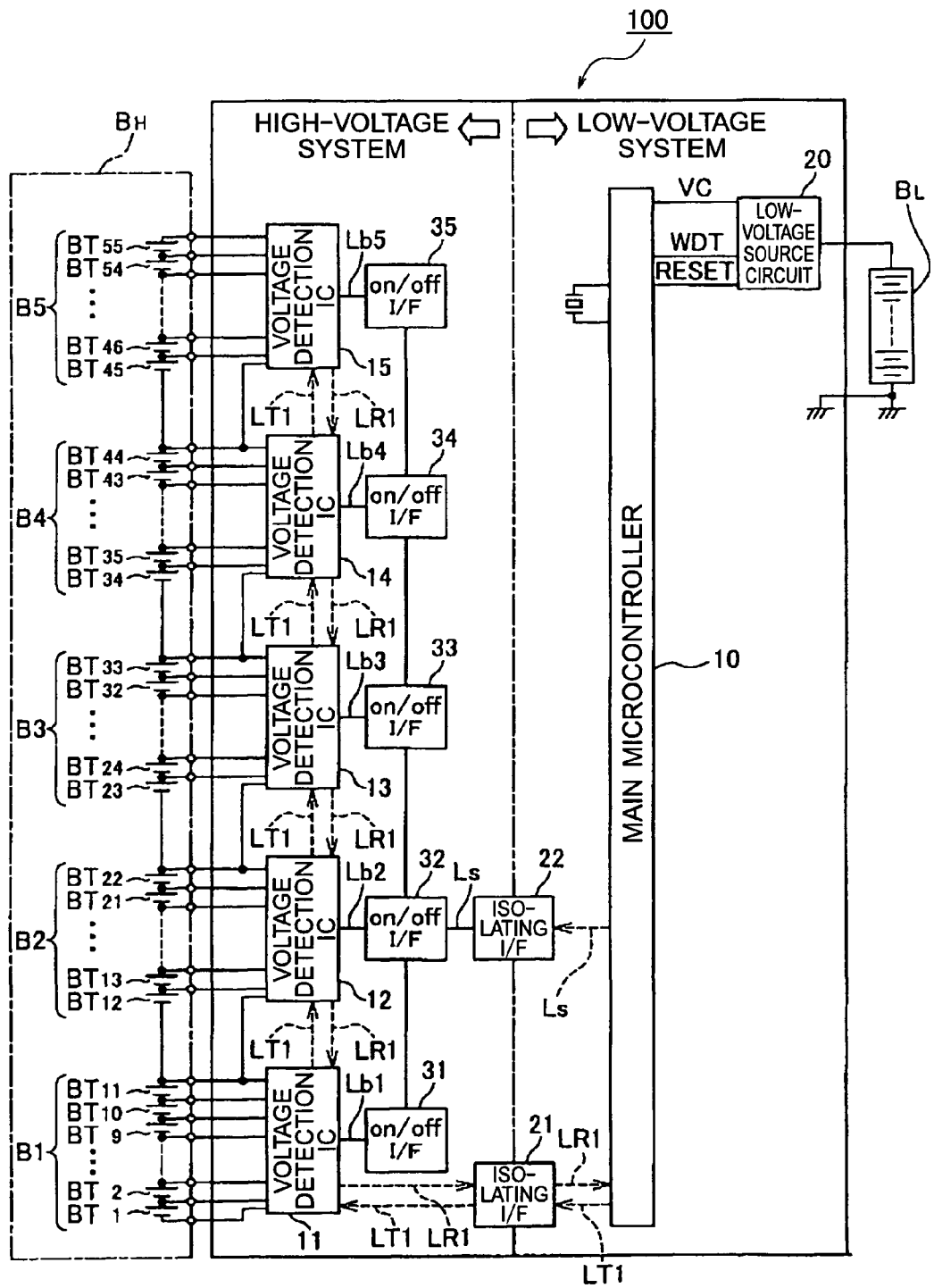
FIG. 1 is a circuit diagram schematically illustrating a voltage detecting device incorporating a disconnection detecting device according to one embodiment of the present invention.

Referring to FIG. 1, there is shown a low-voltage battery BL that includes secondary cells. The low-voltage battery BL serves as a power source for driving a starter that starts an engine. Although not shown, an alternator may be connected to both ends of the low-voltage battery BL as a charger.

In the same figure, there is shown a high-voltage battery BH that serves as a power source for an electric motor in a hybrid electric vehicle (HEV) that is driven by an internal combustion engine and the electric motor. Although not shown, an engine as a load and an alternator as a charger may be connected to both ends of the high-voltage battery BH.

The high-voltage battery BH may be divided into five battery blocks B1 to B5. The battery blocks B1 to B5 may each include eleven unit cells BT1 to BT11, BT12 to BT22, BT23 to BT33, BT34 to BT44, and BT45 to BT55, respectively. These unit cells BT1 to BT55 are each constructed by one secondary cell.

Still referring to FIG. 1, the voltage detecting device 100 includes a main microcontroller 10 as a control unit, and voltage-detection integrated circuit ICs 11 to IC15 as a voltage detection unit. Also, as shown in the same figure, the voltage detecting device 100 may be divided into a high-voltage system and a low-voltage system.

The main microcontroller 10 includes a well-known CPU, a ROM unit, and a RAM unit. The main microcontroller 10 is powered by a low-voltage source circuit 20 and configured to control the voltage-detection integrated circuits IC11 to IC15. The low-voltage source circuit 20 is configured to generate an operating voltage VC for the main microcontroller 10 on the basis of a supply voltage provided by the low-voltage battery BL.

The voltage-detection integrated circuits IC11 to IC15 are provided on a per-block basis for each of the battery blocks B1 to B5. The voltage-detection integrated circuits IC11 to IC15 are only powered by the battery blocks B1 to B5 to which they are respectively dedicated. In other words, the voltage-detection integrated circuits IC11 to IC15 are individually powered by their corresponding unit cells BT1 to BT11, BT12 to BT22, BT23 to BT33, BT34 to BT44, and BT45 to BT55 of the battery block B1 to B5. More specifically, the voltage-detection integrated circuits IC11 to IC15 are each driven with a positive electric potential of a highest-ordered unit cell BT11, BT22, BT33, BT44, and BT55 of the corresponding battery blocks B1 to B5 serving as a power source electric potential, respectively, and with a negative electric potential of a lowest-ordered unit cell BT1, BT12, BT23, BT34, and BT45 of the battery block B1 to B5 serving as a ground electric potential. Such an on-a-per-block basis configuration allows a break down voltage of devices constituting the voltage-detection integrated circuits IC11 to IC15 to be decreased.

Figure 2:
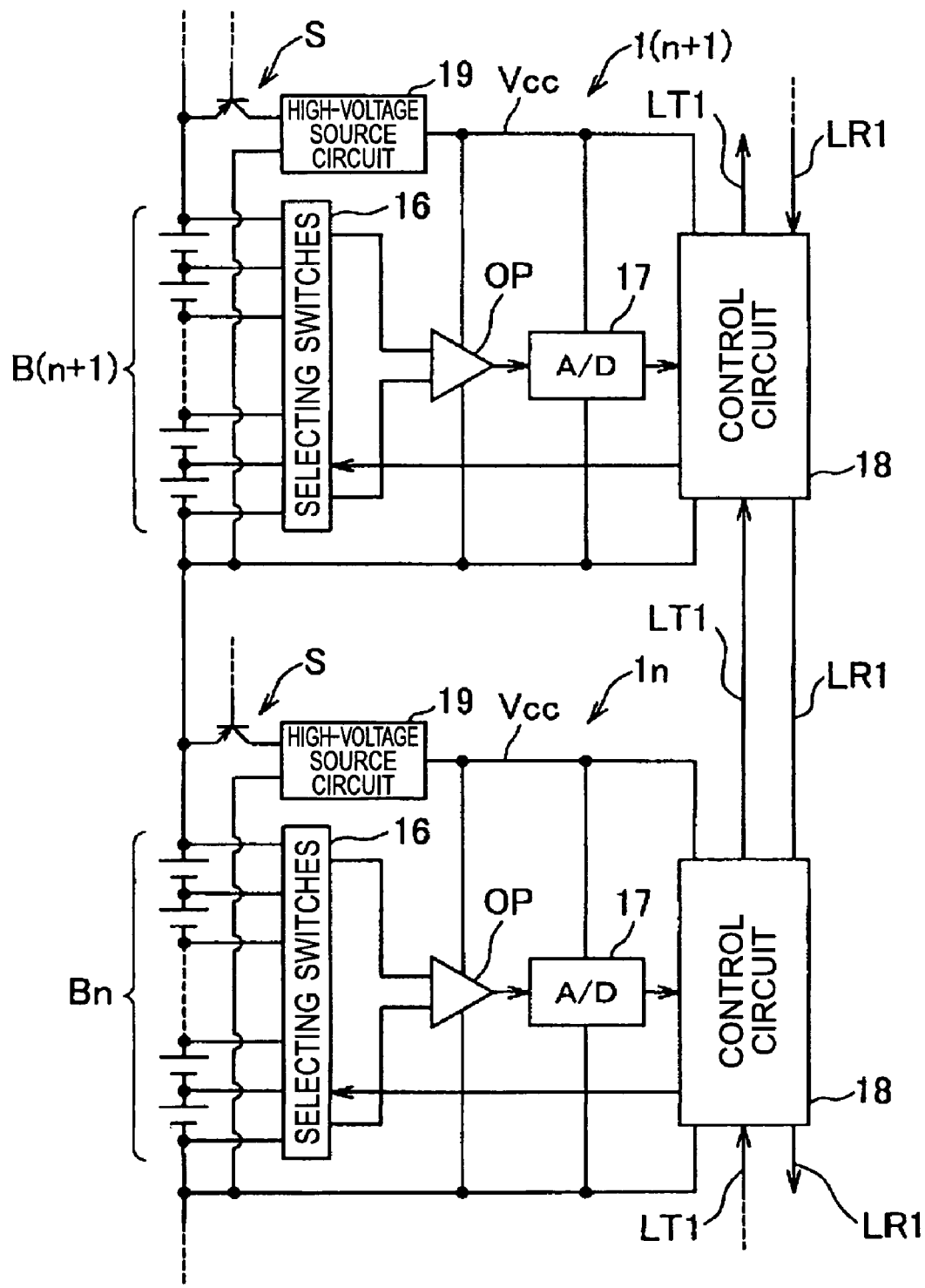
FIG. 2 is a circuit diagram illustrating details of the voltage-detection, integrated circuit of FIG. 1.

Referring to FIG. 2, the voltage-detection integrated circuits IC11 to IC15 each include selecting switches 16, a differential amplifier OP, an analog-to-digital (A/D) converter 17, a control circuit 18, a high-voltage source circuit 19, and a breaking switch S. The selecting switches 16 are each constructed by normally-opened switches provided at both ends of the corresponding unit cells BT1 to BT55, and each configured to selectively connect a corresponding pair of the both ends of the unit cells BT1 to BT55 to the differential amplifier OP.

The differential amplifier OP outputs a voltage between both ends of the corresponding unit cells BT1 to BT55 connected by the selecting switches 16 to the A/D converter 17.

The A/D converter 17 is configured to receive the voltage between both ends of the corresponding unit cells BT1 to BT55 that has been output by the differential amplifier OP, perform analog-to-digital conversion of the received voltage between both ends of the corresponding unit cells BT1 to BT55, and output an A-D converted value of the received voltage between both ends to the control circuit 18.

The control circuit 18 may include a well-known CPU, ROM unit, and a RAM unit, and is configured to control overall functionality of the corresponding voltage-detection integrated circuits IC11 to IC15.

It should be noted that the control unit 18, when entering a disconnection detection mode, functions as a disconnection detecting unit that performs disconnection detection operation (to be later described).

The high-voltage source circuit 19 generates an operating voltage Vcc for the differential amplifier OP, the A/D converter 17, and the control circuit 18 on the basis of a supply voltage of the corresponding battery blocks B1 to B5.

The breaking switch S is connected to the high-voltage source circuit 19 at a region near the corresponding battery blocks B1 to B5. The breaking switch S is used to turn on/off the voltage between both ends of the battery blocks B1 to B5 supplied to the high-voltage source circuit 19, and thereby turn on/off the power supplied to the voltage-detection integrated circuits IC11 to IC15. The breaking switch S may be a PNP transistor.

Referring again to FIG. 1, the voltage detecting device 100 includes a first transmission line LT1 and a first reception line LR1, these two lines constituting a first communication line, and a first isolating interface (I/F) 21. The voltage-detection integrated circuits IC11 to IC15 are connected in series with each other via the first transmission line LT1 and the first reception line LR1. Since the voltage-detection integrated circuits IC11 to IC15 each have different ground levels, it is necessary to provide a level-shift circuit (not shown) on the first transmission line LT1 and the first reception line. LR1, respectively, between the voltage-detection integrated circuits IC11 to IC15.

Also, the main microcontroller 10 is connected to the voltage-detection integrated circuit IC11 via the first transmission line LT1 and the first reception line LR1, the voltage-detection integrated circuit IC11 being the lowest-ordered one of the voltage-detection integrated circuits IC11 to IC15. More specifically, the main microcontroller 10, voltage-detection integrated circuit IC11, voltage-detection integrated circuit IC12, voltage-detection integrated circuit IC13, voltage-detection integrated circuit IC14, and voltage-detection integrated circuit IC15 are connected in series with each other in order of appearance via the first transmission line LT1 and the first reception line LR1.

The first isolating interface (I/F) 21 is provided on the first transmission line LT1 and the first reception line LR1 between the lowest-ordered voltage-detection integrated circuit IC11 and the main microcontroller 10. The first isolating interface (I/F) 21 is configured to connect the voltage-detection integrated circuit IC11 to the main microcontroller 10 while electrically isolating these two components. The lowest-ordered voltage-detection integrated circuit IC11 and the main microcontroller 10 can transmit and receive data while electrically isolated by the first isolating interface (I/F) 21. Thus, it is possible to maintain an electrically isolated state of the high-voltage battery BH and the low-voltage battery BL with respect to each other. The first isolating interface (I/F) 21 may be a known photocoupler including a light emitting device and a light-receiving element or a magnetic coupler.

Figure 3:
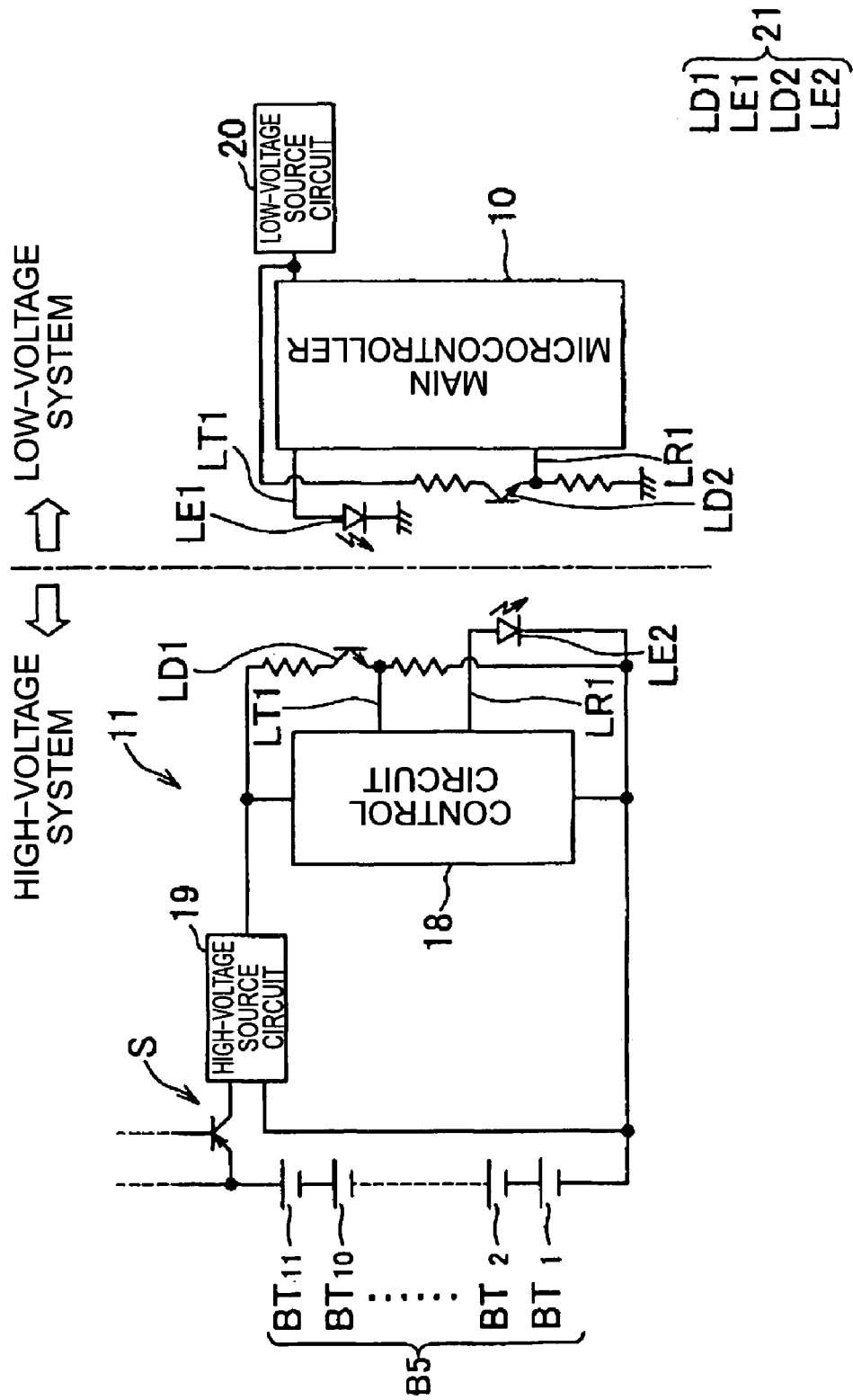
FIG. 3 is a detailed electric connection diagram of FIG. 1, where a photocoupler is used as a first isolating interface.

Referring to FIG. 3 illustrating in detail an electrical connection diagram of the voltage detecting device 100 of FIG. 1, a photocoupler is used as the first isolating interface (I/F) 21. The figure omits details of the voltage-detection integrated circuit IC11 for simplicity. As shown in the same figure, the first isolating interface (I/F) 21 includes a light-emitting element LE1 and a light-receiving element LD2 in the low-voltage system, and a light-emitting element LE2 and a light-receiving element LD1 in the high-voltage system. As shown in the same figure, one end of the light-emitting element LE1 is connected to the main microcontroller 10, and the other end thereof to a ground. The light-emitting element LE1 is configured to emit a light when a current is allowed to flow in the element LE1 by an electrical signal output by the main microcontroller 10.

Meanwhile, the light-receiving element LD1 is provided between the high-voltage source circuit 19 of the battery block B1 and a negative (minus terminal) of the unit cell BT1. The light-receiving element LD1 is configured to be enabled upon reception of the light from the light-emitting element LE1, and then supply an electrical signal via the first transmission line LT1 to the control circuit 18.

This configuration makes it possible to send the electrical signal from the main microcontroller 10 to the control circuit 18 of the battery block B1 while the main microcontroller 10 and the control circuit 18 are electrically isolated from each other.

Also, one end of the light-emitting element LE2 is connected to the control circuit 18 and the other end thereof to the negative of the unit cell BT1. The light-emitting element LE2 is configured to emit a light when a current is allowed to flow in the element LE2 by an electrical signal output by the control circuit 18.

Meanwhile, the light-receiving element LD2 is provided between the low-voltage source circuit 20 and a ground. The light-receiving element LD2 is configured to be enabled upon reception of the light from the light-emitting element LE2, and transmits an electrical signal via the first reception line LR1 to the main microcontroller 10.

This configuration makes it possible to send the electrical signal from the control circuit 18 of the battery block B1 to the main microcontroller 10 while the control circuit 18 and the main microcontroller 10 are electrically isolated from each other.

Figure 4:
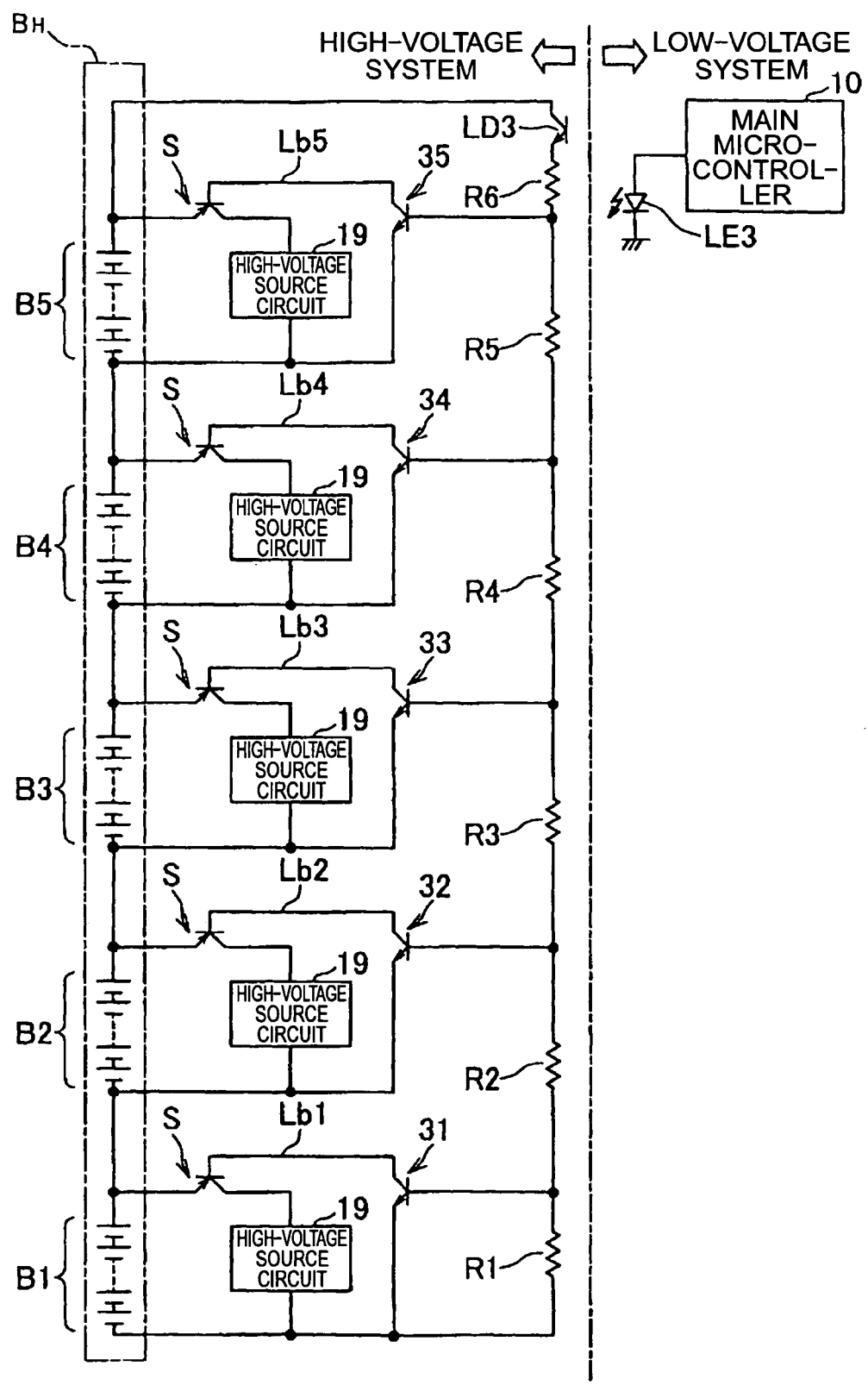
FIG. 4 is a detailed electric connection diagram of FIG. 1, where a photocoupler is used as a second isolating interface.

Referring again to FIG. 1, the voltage detecting device 100 further includes: a second transmission line LT2 constituting a second communication line; a second isolating interface (I/F) 22; and an ON/OFF interfaces I/F 31 to 35, so that the breaking switch S can be turned on in accordance with output of a power-source signal by the main microcontroller 10. Specifically, PNP transistors each constituting the breaking switches S is connected to the main microcontroller 10 connected via the second transmission line LT2. The second transmission line LT2 includes a main line Ls whose one end is connected to the main microcontroller 10, and a plurality of branching lines Lb1 to Lb5 that branches at the other e end of the main line Ls. As shown in FIG. 4, the other end of the branching lines Lb1 to Lb5 are each connected to the bases of the PNP transistors constituting the breaking switches S.

As shown in FIG. 1, the second isolating interface (I/F) 22 is provided on the main line Ls and configured to connect the breaking switch S and the main microcontroller 10 while electrically isolating these components from each other. Thus, it is possible to maintain an electrically insulated state of the high-voltage battery BH and the low-voltage battery BL with respect to each other. The second isolating interface (I/F) 22 may be a known photocoupler including a light emitting device and a light-receiving element or a magnetic coupler. The ON/OFF interfaces (I/F) 31 to 35 are each provided on corresponding each of the branching lines lb1 to lb5, and configured to convert the power-source signal sent from the main microcontroller 10 into a signal having a signal level suitable to enabling and disabling the breaking switches S.

Next, the detailed configuration of the second transmission line LT2 as the above-described second communication line, the second isolating interface (I/F) 22, and the ON/OFF interfaces (I/F) 31 to 35 is described with reference to FIG. 4. As shown in the same figure, the second isolating interface (I/F) 22 includes a light-emitting element LE3 in the low-voltage system and a light-receiving element LD3 in the high-voltage system. As shown in the same figure, one end of the light-emitting element LE3 is connected to the main microcontroller 10 and the other end thereof to a ground, so that the light-emitting element LE3 is configured to emit a light when a current is allowed to flow in the element LE3 by an electrical signal output by the main microcontroller 10.

Meanwhile, one end of the light-receiving element LD3 is connected to a positive (plus terminal) of the highest-ordered battery block B5 and the other end thereof connected via the voltage-dividing resistors R1 to R6 to the negative (minus terminal) of the lowest-ordered battery block B1.

Also, a contact point of the voltage-dividing resistor R1 and the voltage-dividing resistor R2 is connected to a base of an NPN transistor constituting the ON/OFF interface (I/F) 31.

In a similar fashion, a contact point of the voltage-dividing resistor. R2 and the voltage-dividing resistor R3 is connected to a base of an NPN transistor constituting the ON/OFF interface (I/F) 32.

Likewise, a contact point of the voltage-dividing resistor R3 and the voltage-dividing resistor R4 is connected to a base of an NPN transistor constituting the ON/OFF interface (I/F) 33.

In a similar way, a contact point of the voltage-dividing resistor R4 and the voltage-dividing resistor R5 is connected to a base of an NPN transistor constituting the ON/OFF interface (I/F) 34.

Also, a contact point of the voltage-dividing resistor R5 and the voltage-dividing resistor R6 is connected to a base of an NPN transistor constituting an ON/OFF interface (I/F) 35.

Emitters of the NPN transistors each constituting the ON/OFF interfaces (I/F) 31 to 35 are each connected to a negative of corresponding each of the battery blocks B1 to B5. Collectors of the NPN transistors constituting the ON/OFF interfaces (I/F) 31 to 35 are each connected to the bases of the corresponding each of the PNP transistors each constituting the breaking switches S.

With the above-described configuration, when the main microcontroller 10 transmits the power-source signal to the light-emitting element LE3, current flows in the light-emitting element LE3 and the element LE3 emits the light. The light-receiving element LD3 is configured to be enabled upon reception of the light from the light-emitting element LE3.

Upon enabling of the light-receiving element LD3, the NPN transistors each constructing the ON/OFF interfaces (I/F) 31 to 35 are also enabled.

Further, upon enabling of the each of the ON/OFF interfaces I/F 31, the PNP transistors each constituting the breaking switches S are enabled, so that the power is supplied to each of the voltage-detection integrated circuits IC11 to IC15. Specifically, through transmission of the power-source signal by the main microcontroller 10, it is possible to individually control enabling and disabling of the voltage-detection integrated circuits IC11 to IC15.

Figure 5:
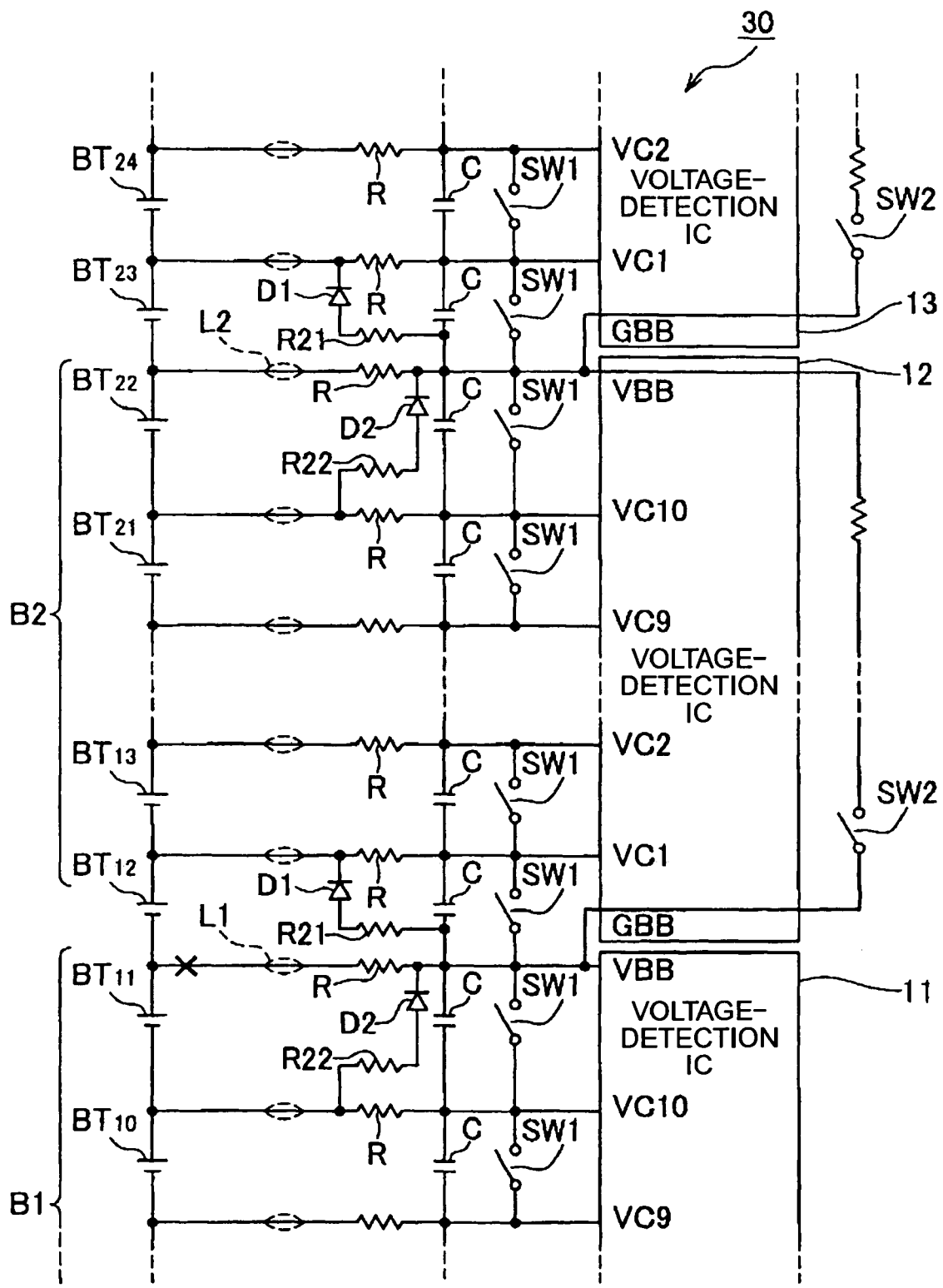
FIG. 5 is a detailed circuit diagram focusing on a portion between unit cells BT10 to BT24 and voltage-detection integrated circuits 11 to 13 of FIG. 1.

Referring now to FIG. 5, the following describes the configuration of a disconnection detecting device 30 incorporated in the above-described voltage detecting device 100.

The disconnection detecting device 30 is a device configured to detect disconnection of electrical wires L1 to L4 illustrated in FIG. 1.

The electrical wire L1 is an electrical wire that connects (a) a connection point of the adjacently-connected pairs of battery block B2 (which may be called a "higher-ordered battery block") and the battery block B1 (which may be called "lower-ordered battery block") to (b) two terminals, i.e., a ground terminal (GBB) of the voltage-detection integrated circuit IC12 and a power supply terminal (VBB) of the voltage-detection integrated circuit IC11.

Also, the electrical wire L2 is an electrical wire that connects (a) a connection point of the adjacently-connected pairs of the battery block B3 (higher-ordered battery block) and the battery block B2 (lower-ordered battery block) to (b) a ground terminal (GBB) of the voltage-detection integrated circuit IC13 and a power supply terminal (VBB) of the voltage-detection integrated circuit IC12.

Further, the electrical wire L3 is an electrical wire that connects (a) a connection point of the adjacently-connected pairs of the battery block B4 (higher-ordered battery block) and the battery block B3 (lower-ordered battery block) to (b) a ground terminal (GBB) of the voltage-detection integrated circuit IC14 and a power supply terminal (VBB) of the voltage-detection integrated circuit IC13.

Likewise, the electrical wire L4 is an electrical wire that connects (a) a connection point of the adjacently-connected pairs of the battery block B5 (higher-ordered battery block) and the battery block B4 (lower-ordered battery block) to (b) a ground terminal (GBB) of the voltage-detection integrated circuit IC15 and a power supply terminal (VBB) of the voltage-detection integrated circuit IC14.

As shown in FIG. 5, the disconnection detecting device 30 includes: a plurality of resistors R; a plurality of switch elements SW1; a plurality of capacitors C; a plurality of switch elements SW2; a plurality of pairs of resistor R21 and diode D1; and a plurality of pairs of resistor R22 and diode D2.

The resistors R are each provided between the ends of the corresponding unit cells BT1 to BT55 and the corresponding voltage-detection integrated circuits IC11 to IC15.

The switch elements SW1 are each connected via the resistor R to and in parallel with the unit cells BT1 to BT55.

The capacitors C are each connected via the resistor R to and in parallel with the unit cells BT1 to BT55, and connected to the corresponding switch elements SW1. The switch elements SW1 and the capacitors C are the same in number as the unit cells BT1 to BT55.

A noise filter circuit that removes a noise component from the voltage between both ends of the unit cells BT1 to BT55 is constructed by (a) the resistors R provided between the both ends of the unit cells BT1 to BT55 and (b) the capacitor C connected in parallel with the unit cells BT1 to BT55.

Also, a bypass circuit that discharges the unit cells BT1 to BT55 is constructed by the resistor R and the switch element SW1. Specifically, either one of the switch elements SW1 that corresponds to either one of the unit cells BT1 to BT55 whose voltage between both ends is high is turned on so that the unit cell of interest among the unit cells BT1 to BT55 can be discharged and as a result the voltages between both ends of the unit cells BT1 to BT55 can be equalized.

The switch elements SW2 are each provided between the power supply terminal VBB and the ground terminal GBB of the corresponding voltage-detection integrated circuits IC12 to 15 dedicated to the higher-ordered-side battery blocks B2 to B5. Thus, when the switch element SW2 is turned on, impedance of a corresponding one of the voltage-detection integrated circuits IC12 to IC15 becomes smaller.

The resistor R21 and the diode D1 as a first diode are connected between both ends of the lowest-ordered unit cells BT12, BT23, BT34, and BT45 of the higher-ordered-side battery block B2 to B5 out of the adjacently-connected pairs of the battery blocks B1 and B2, B2 and B3, B3 and B4, and B4 and B5. The diodes D1 are each connected in series with the corresponding lowest-ordered unit cells BT12, BT23, BT34, and BT45 in a forward direction from a negative terminal to a positive terminal thereof. Since an electric potential of the voltage-detection integrated circuits IC12 to IC15 is clamped by the diode D1, the electric potential of the ground terminal GBB of the voltage-detection integrated circuits IC12 to IC15 does not exceed the diode voltage of the diode D1 and thus can be prevented from rising above the electric potential of the positive terminal of each of the lowest-ordered unit cells BT12, BT23, BT34, and BT45 beyond the diode voltage.

The resistor R22 and the diode D2 as a second diode are connected between both ends of the highest-ordered unit cell BT11, BT22, BT33, and BT44 of the lower-ordered battery blocks B1 to B4 out of the adjacently-connected pairs of the battery blocks B1 and B2, battery blocks B2 and B3, battery blocks B3 and B4, and battery blocks B4 and B5. The diode D2 is connected in series with the highest-ordered unit cell BT11, BT22, BT33, and BT44 in a forward direction from a negative terminal to a positive terminal thereof. Since an electric potential of the power supply terminal VBB of the voltage-detection integrated circuits IC11 to IC14 is clamped by the diode D2, the electric potential of the power supply terminal VBB of the voltage-detection integrated circuits IC11 to IC14 does not exceed the diode voltage of the diode D2 and can be prevented from rising above the electric potential of the negative terminal of each of the highest-ordered unit cells BT11, BT22, BT33, and BT44 beyond the diode voltage.

The following describes the principles of disconnection detection of the disconnection detecting device 30 incorporated in the voltage detecting device 100. For simplicity, only the disconnection of the electrical wire L1 connected between the battery block B1 and the battery block B2 is explained. The same principles and operation apply to the disconnection detection for the electrical wires L2 to L4.

Figure 6:
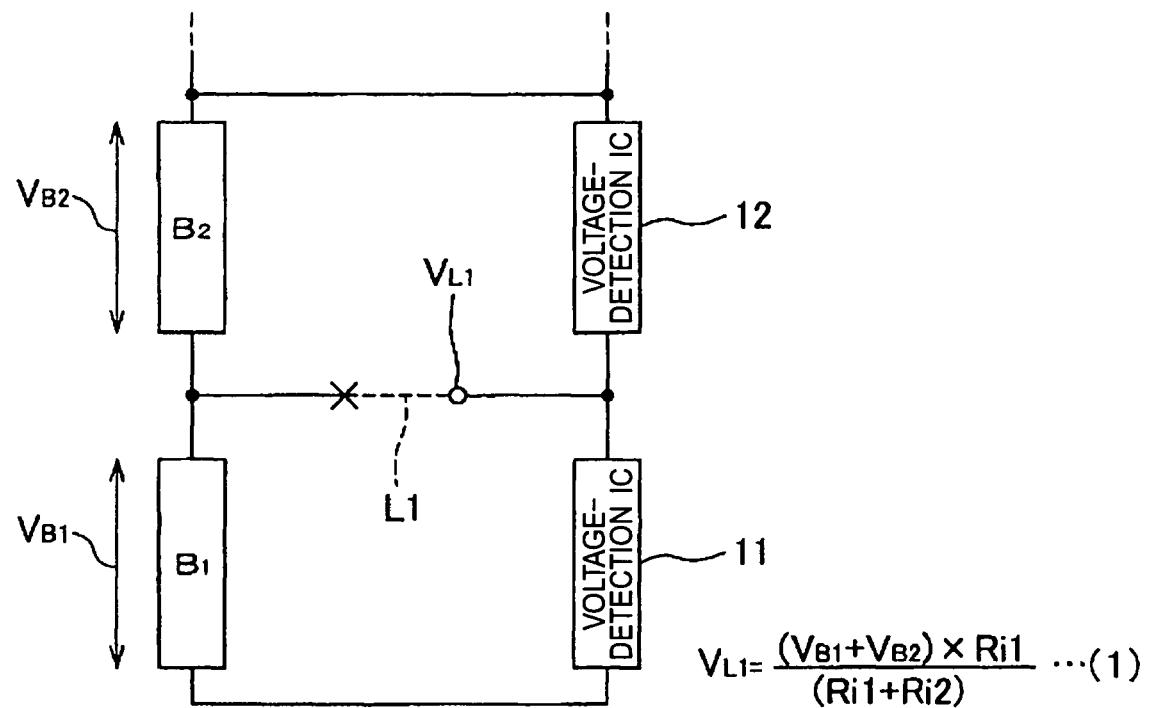
FIG. 6 is a circuit diagram for illustration of a voltage VL1 when an electrical wire L1 is disconnected.

As has been explained in the discussion of the background art, when the electrical wire L1 is disconnected, the wire L1 being connected to the ground terminal GBB of the voltage-detection integrated circuit IC12 for the battery block B2 and to the power supply terminal VBB of the voltage-detection integrated circuit IC11 for the battery block B1, then a voltage is generated depending upon a proportion of impedance of the voltage-detection integrated circuit IC12 to impedance of the voltage-detection integrated circuit IC11. Specifically, as shown in FIG. 6, a voltage $V_{L1}$ of the electrical wire L1 that has been disconnected can be expressed by the following equation 1:

$$V_{L1}=(V_{B1}+V_{B2})\times Ri1/(Ri1+Ri2) \quad (1)$$

where $V_{B1}$ and $V_{B2}$ are a voltage between both ends of the battery blocks B1, B2 connected to the voltage-detection integrated circuit IC11 and voltage-detection integrated circuit IC12, respectively; Ri1, Ri2 are the impedance of the voltage-detection integrated circuit IC11, IC12, respectively, whose electric potential is determined relative to the impedance Ri1 of the voltage-detection integrated circuit IC11 for the battery block B1 and an impedance Ri2 of the voltage-detection integrated circuit IC12 for the battery block B2.

When the switch element SW2 is turned on in such a state of disconnection of the electrical wire L1 and thus the impedance of the voltage-detection integrated circuit IC12 for the higher-ordered battery block B2 becomes smaller, the proportion of the impedance Ri1 of the voltage-detection integrated circuit IC12 to the impedance Ri2 of the voltage-detection integrated circuit IC12 will exit a state of balance, so that voltage-dividing corresponding to the impedance occurs.

As a result, the electric potential of the ground terminal GBB of the voltage-detection integrated circuit IC12 is pulled by the electric potential of the power supply terminal VBB, i.e., pulled by the positive electric terminal of the highest-ordered unit cell BT22 and becomes larger than that of the positive terminal of the lowest-ordered unit cell BT12.

In proportion to the impedance's becoming smaller, the electric potential of the ground terminal GBB of the voltage-detection integrated circuit IC12 becomes larger. When the impedance becomes sufficiently smaller, then it is clamped by the diode D1, so that the electric potential of the ground terminal GBB of the voltage-detection integrated circuit IC12 becomes equal to a value obtained by adding the diode voltage to the positive electric potential of the lowest-ordered unit cell BT12. Thus, when the voltage between both ends of the lowest-ordered unit cell BT12 is detected by the voltage-detection integrated circuit IC12 in the case of disconnection of the electrical wire L1, then the detected value will be a negative voltage.

Meanwhile, if the electrical wire L1 is not disconnected, the electric potential of the ground terminal GBB of the voltage-detection integrated circuit IC12 remains equal to the electric potential of the negative terminal of the lowest-ordered unit cell BT12. In such a normal state, the electric potential of the ground terminal GBB of the voltage-detection integrated circuit IC12 also remains equal to the electric potential of the negative terminal of the lowest-ordered unit cell BT12 even when circuit current flowing in the voltage-detection integrated circuit IC12 and the circuit current flowing in the voltage-detection integrated circuit IC11 are exited from a state of balance with the switch element SW turned on.

Accordingly, when the voltage between both ends of the lowest-ordered unit cell BT12 is detected by the voltage-detection integrated circuit IC12 during the normal state, the detected value will be a positive voltage.

In accordance with the above-described principles, the disconnection detecting device 30 of the present invention detects the disconnection on the basis of the voltage between both ends of the lowest-ordered unit cell BT12 that is measured while the switch element SW2 is turned on.

Figure 7:
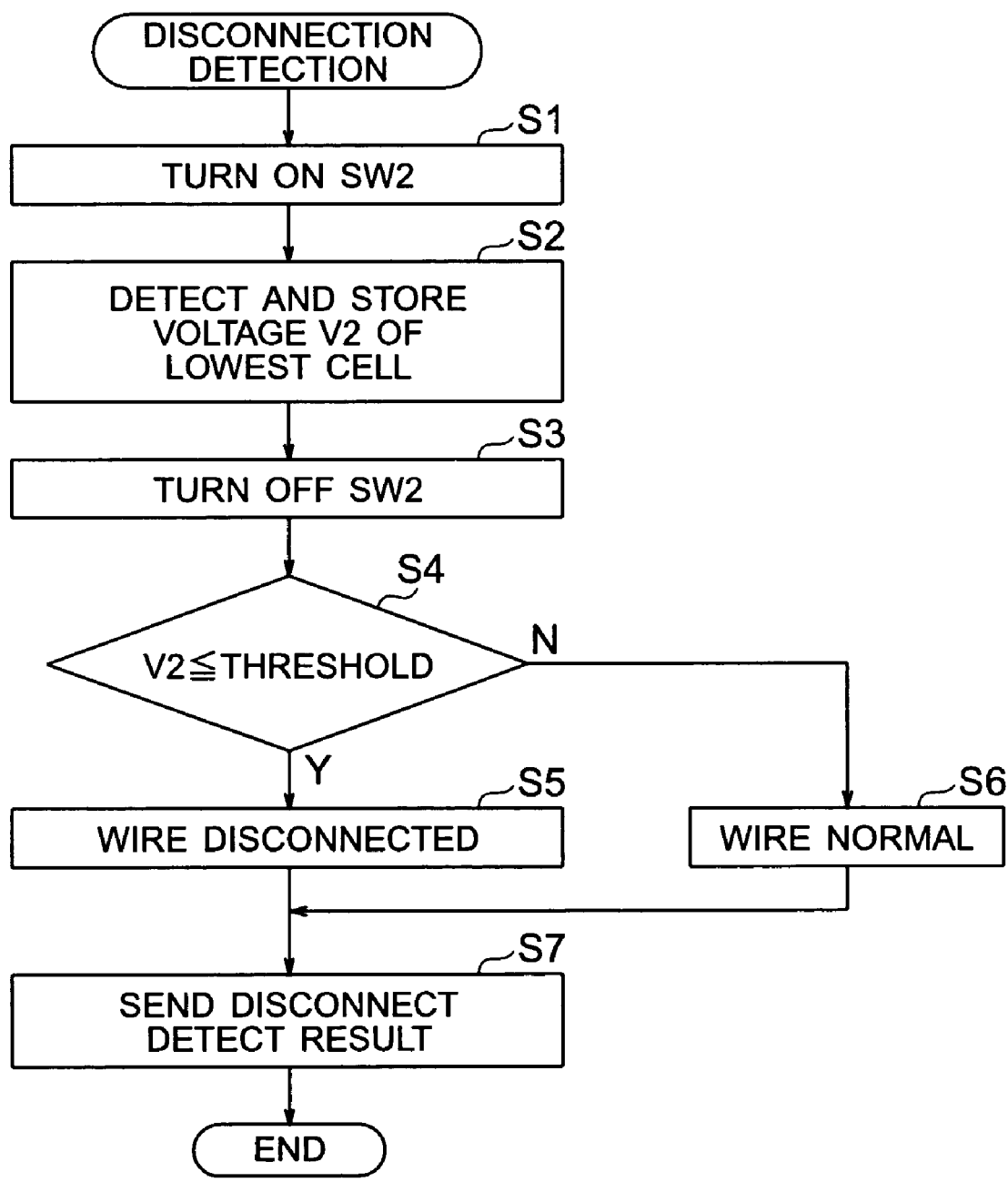
FIG. 7 is a flowchart of disconnection detection procedure by a control unit of FIG. 2.

On the basis of the above-described principles of disconnection detection, disconnection detection operation by the voltage detecting device 100 with the above-described configuration is to be explained with reference to FIG. 7.

First, the main microcontroller 10, after entering the disconnection detection mode, starts the disconnection detection operation and transmits a detect-disconnection instruction to the control unit 18 of the battery block B1 that is connected to main microcontroller 10 via the first transmission line LT1. The detect-disconnection instruction is transferred via the first transmission line LT, from the control circuit 18 of the battery block B1 to the control circuits 18 of the higher-ordered battery blocks B2 to B5, in order of appearance.

After that, the control circuit 18 controls and turns on the switch element SW2 and lowers the impedance of the voltage-detection integrated circuit IC12 (step S1).

Next, the control circuit 18 detects the voltage between both ends of the lowest-ordered unit cell BT12 and stores it as the voltage between both ends V2 in the RAM unit (step S2), and then controls and turns off the switch element SW2 (step S3). As has been explained in the foregoing, if the electrical wire L1 is not disconnected, then the voltage between both ends V2 will assume a positive voltage, and if the electrical wire L1 is disconnected, then the voltage between both ends V2 becomes smaller.

Also, the control circuit 18 serves as the disconnection detecting unit. If the voltage between both ends V2 is equal to or less than the threshold (i.e., when Y in step S4), then the control circuit 18 judges that the electrical wire L1 is disconnected, and the judgment result is stored as a disconnection detection result in the RAM unit (step S5). When the impedance is set to be sufficiently small, the voltage between both ends V2 will assume a negative value.

Meanwhile, the control circuit 18 judges that the electrical wire L1 is in a normal state if the detected voltage between both ends V2 is larger than the threshold (i.e., when NO in step S4), and the judgment result is stored in the RAM unit as the disconnection detection result (step S6).

After that, the control circuit 18 transmits information on the disconnection detection result to the main microcontroller 10 (step S7) and exits the operation.

In the same manner, the control units 18 of the battery blocks B3 to B5 perform disconnection detection processing. The main microcontroller 10 receives the disconnection detection results and, if it is judged that there exists the disconnection, it will be notified.

According to the above-described embodiment, the disconnection of the electrical wire L1 is judged on the basis of the voltage between both ends of the lowest-ordered unit cell BT12 that has been detected by the voltage-detection integrated circuit IC12 when the switch element SW2 is turned on.

When the switch element SW2 is turned off, the electric potential of the ground terminal GBB of the voltage-detection integrated circuit IC12 will be a value substantially intermediate between the positive electric potential of the highest-ordered unit cell BT22 of the battery block B2 and the negative electric potential of the lowest-ordered unit cell BT1 of the battery block B1, and, as a result, the source voltage supplied to the voltage-detection integrated circuit IC12 does not vary in a large measure between a case of the disconnection and a case of a normal state, so, that the disconnection can be effectively detected with an inexpensive circuit configuration.

Also, according to the above-described embodiment, the control circuit 18 is configured to detect the disconnection on the basis of the comparison of (a) the voltage between both ends V2 of the lowest-ordered unit cell BT12 that has been detected by the voltage-detection integrated circuit IC12 when the switch element SW2 is turned on with (b) the threshold, so that the disconnection can be accurately detected.

Also, according to the above-described embodiment, the diode D1 is connected between the both ends of the lowest-ordered unit cell BT12 in the forward direction from the negative terminal of the lowest-ordered unit cell BT12 of the battery block B2 to its positive terminal. Also, the diode D2 is connected between the both ends of the highest-ordered unit cell BT11 in the forward direction from the negative terminal of the highest-ordered unit cell BT11 of the battery block B1 to its positive terminal. By virtue of clamping effect of the diodes D1 and D2, the voltage supplied to the ground terminal GBB of the voltage-detection integrated circuit IC12 and the power supply terminal VBB of the voltage-detection integrated circuit IC11 does not become too large even when the switch element SW2 is turned on, so that it is possible to prevent occurrence of an abnormal state in the voltage-detection integrated circuits IC11 and IC12.

It should be noted that, in the context of this document, the term "order" as in "lowest-ordered" and "highest-ordered" is used for convenience of explanation, only representing an order of appearance of a specific voltage-detection component within a sequence of the voltage-detection components that are series-connected to each other.

While the invention has been described in terms of specific embodiments, it will be understood by those skilled in the art that various modifications may be made therein without departing from the spirit and scope of the invention. Also, the terms and expressions which have been employed in this specification are used for description and not for limitation, there being no intention in the use of such terms and expressions of excluding equivalents of the features shown and described or portions thereof. Accordingly, the scope of this invention is only defined and limited by the following claims and their equivalents.

What is claimed is:

1. A disconnection detecting device for a battery including battery blocks each constructed by series-connected unit cells, the device being configured to detect a disconnection of an electrical wire that connects a connection point of an adjacently-connected pair of a higher-ordered battery block and a lower-ordered battery block to a ground terminal of a voltage detection unit configured to detect a voltage between both ends of a unit cell belonging to the higher-ordered battery block and to a power supply terminal of a voltage detection unit configured to detect a voltage between both ends of a unit cell belonging to the lower-ordered battery block, the device comprising:
   a switch element configured to decrease an impedance of the voltage detection unit that detects the voltages between both ends of the unit cells belonging to the higher-ordered battery block; and
   a disconnection detecting unit configured to detect the disconnection of the electrical wire based on a voltage between both ends of a lowest-ordered unit cell of the higher-ordered battery block, the voltage between both ends being detected by the voltage detection unit while the switch element is turned on.

2. The disconnection detecting device according to claim 1, wherein the disconnection detection unit is configured to detect the disconnection of the electrical wire based on comparison of the voltage between both ends of the lowest-ordered unit cell of the higher-ordered battery block with a threshold, the voltage between both ends being detected by the voltage detection unit while the switch element is turned on.

3. The disconnection detecting device according to claim 1, further comprising:
   a first diode connected between both ends of the lowest-ordered unit cell of the higher-ordered battery block in a forward direction from a negative terminal of the lowest-ordered unit cell of the higher-ordered battery block to a positive terminal thereof; and
   a second diode connected between both ends of the highest-ordered unit cell of the lower-ordered battery block in a forward direction from a negative terminal of the highest-ordered unit cell of the lower-ordered battery block to a positive terminal thereof.

4. The disconnection detecting device according to claim 2, further comprising:
   a first diode connected between both ends of the lowest-ordered unit cell of the higher-ordered battery block in a forward direction from a negative terminal of the lowest-ordered unit cell of the higher-ordered battery block to a positive terminal thereof; and
   a second diode connected between both ends of the highest-ordered unit cell of the lower-ordered battery block in a forward direction from a negative terminal of the highest-ordered unit cell of the lower-ordered battery block to a positive terminal thereof.

* * * * *